United States Patent
Okuyama et al.

(10) Patent No.: US 9,640,544 B2
(45) Date of Patent: May 2, 2017

(54) INTEGRATED CIRCUIT WITH HYDROGEN ABSORPTION STRUCTURE

(71) Applicant: SanDisk Technologies, Inc., Plano, TX (US)

(72) Inventors: Arata Okuyama, Aichi (JP); Ryo Urakawa, Yokkaichi (JP); Hiroshi Omi, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/695,426

(22) Filed: Apr. 24, 2015

(65) Prior Publication Data

US 2016/0315091 A1    Oct. 27, 2016

(51) Int. Cl.
| | | |
|---|---|---|
| *H01L 27/115* | (2006.01) |
| *H01L 27/105* | (2006.01) |
| *H01L 27/11524* | (2017.01) |
| *H01L 27/11529* | (2017.01) |
| *H01L 23/26* | (2006.01) |
| *H01L 21/768* | (2006.01) |

(52) U.S. Cl.
CPC .. *H01L 27/11524* (2013.01); *H01L 21/76841* (2013.01); *H01L 23/26* (2013.01); *H01L 27/11529* (2013.01)

(58) Field of Classification Search
CPC ................................................ H01L 27/11524
USPC .......................................... 257/315; 438/257
See application file for complete search history.

(56) References Cited

U.S. PATENT DOCUMENTS

| | | | | |
|---|---|---|---|---|
| 6,781,184 B2* | 8/2004 | Solayappan | .......... | H01L 23/642 257/310 |
| 7,655,531 B2* | 2/2010 | Sashida | ............... | H01L 21/7682 257/E21.008 |
| 2004/0089920 A1* | 5/2004 | Joshi | ..................... | H01L 23/642 257/629 |
| 2005/0205911 A1* | 9/2005 | Udayakumar | .......... | H01L 28/57 257/295 |
| 2006/0286720 A1* | 12/2006 | Yoshida | ............ | H01L 27/11502 438/118 |
| 2008/0121959 A1* | 5/2008 | Izumi | ................ | H01L 27/11502 257/295 |
| 2008/0277706 A1* | 11/2008 | Sashida | ............. | H01L 27/11507 257/295 |

(Continued)

FOREIGN PATENT DOCUMENTS

| | | |
|---|---|---|
| JP | S59-100541 | 6/1984 |
| JP | 05-047753 | 2/1993 |

(Continued)

OTHER PUBLICATIONS

Youn et al., "Reliability Issue of 20 nm MLC NAND Flash," Reliability Physics Symposium (IRPS), 2013 IEEE International, pp. 3B.2.1-3B.2.4.

*Primary Examiner* — Moazzam Hossain

(74) *Attorney, Agent, or Firm* — Foley & Lardner LLP

(57) ABSTRACT

An integrated circuit such as a NAND flash memory includes a dielectric layer overlying transistors (e.g. NAND flash memory cells) that are formed along a surface of a substrate and a hydrogen absorption structure overlying the dielectric layer, the hydrogen absorption structure extending over the transistors, the hydrogen absorption structure being electrically isolated from the transistors.

15 Claims, 9 Drawing Sheets

(56) References Cited

U.S. PATENT DOCUMENTS

| | | | |
|---|---|---|---|
| 2008/0308855 A1* | 12/2008 | El-Kareh | H01L 21/28273 257/314 |
| 2010/0159639 A1 | 6/2010 | Sakata | |
| 2011/0079884 A1* | 4/2011 | Basim | H01L 21/0217 257/632 |
| 2011/0241133 A1 | 10/2011 | Liu | |

FOREIGN PATENT DOCUMENTS

| | | |
|---|---|---|
| JP | 10-321799 | 12/1998 |
| JP | 2001007215 | 1/2001 |
| JP | 2007109974 | 4/2007 |
| JP | 2009252841 | 10/2009 |
| JP | 2010166030 | 7/2010 |
| JP | 2011210999 | 10/2011 |

\* cited by examiner

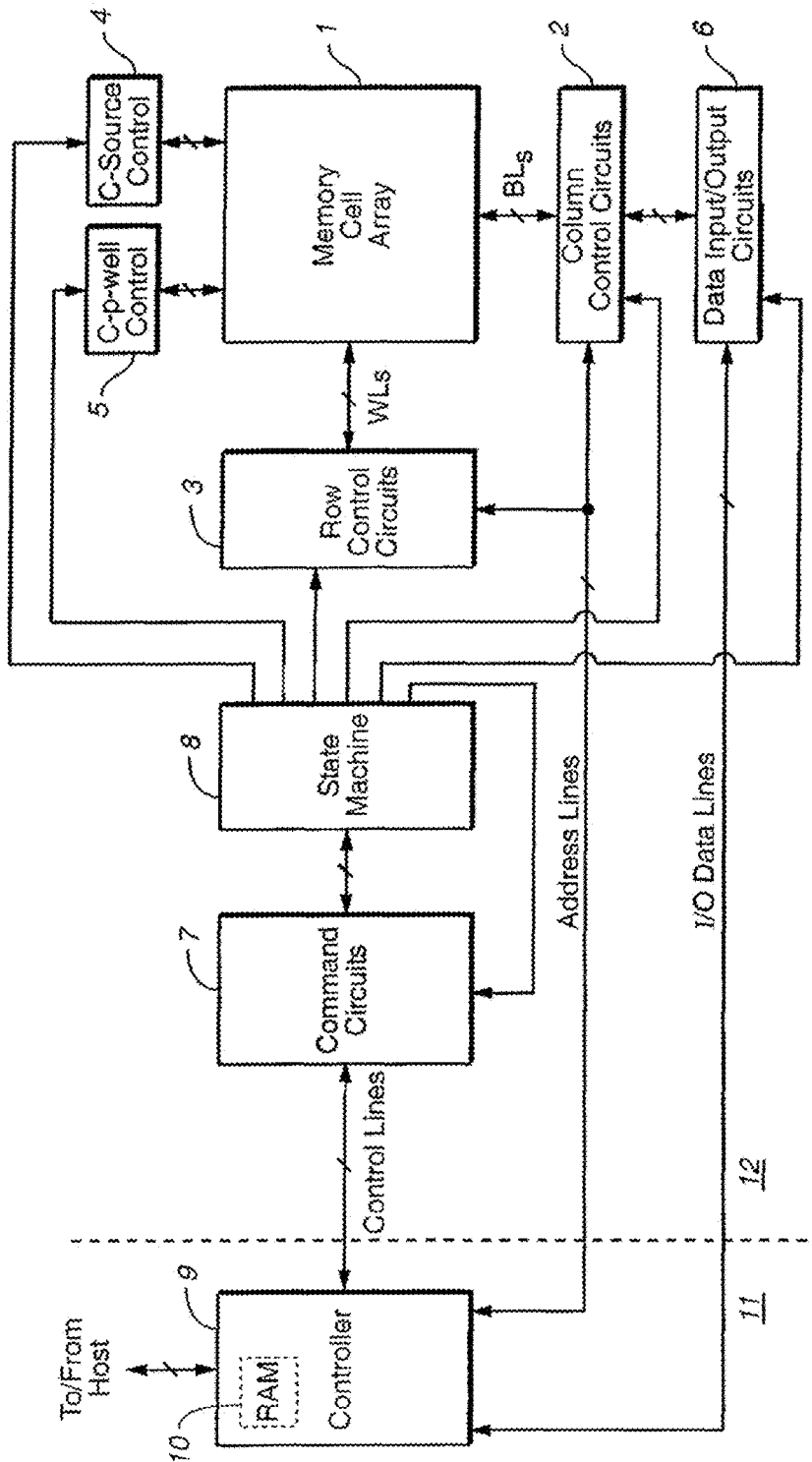
FIG._1
*(Prior Art)*

(Section A-A)

(Section B-B)

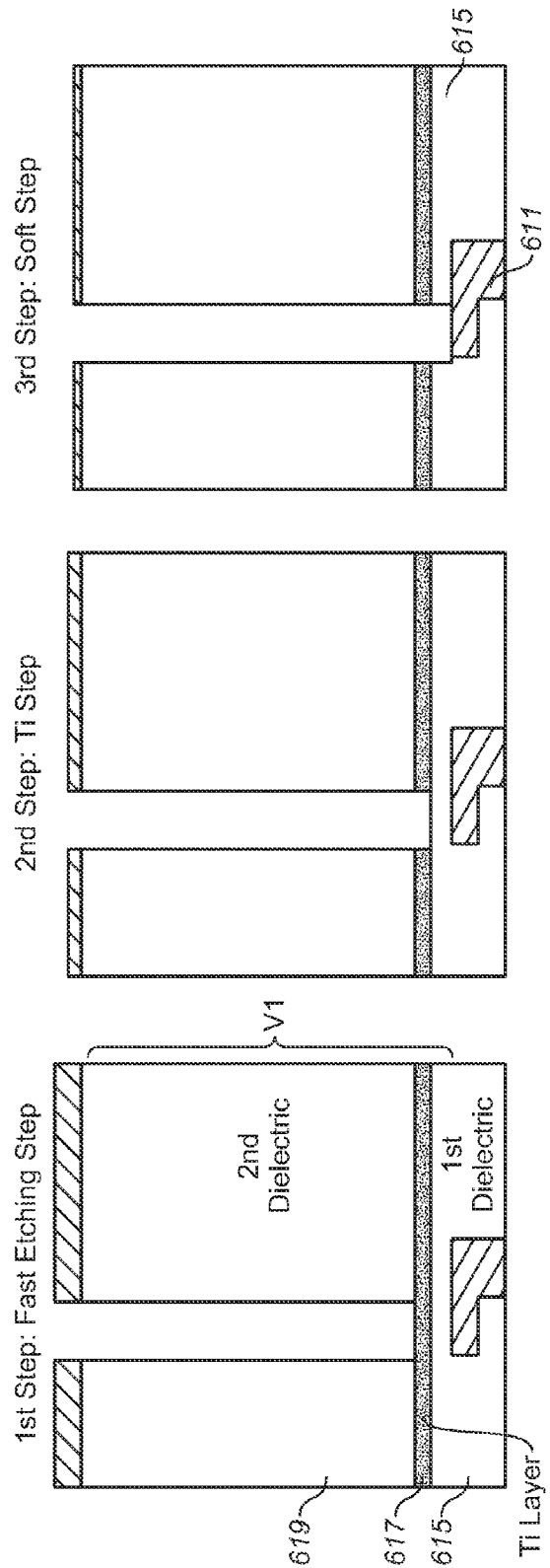

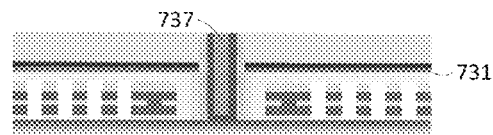
FIG. 7A  FIG. 7B
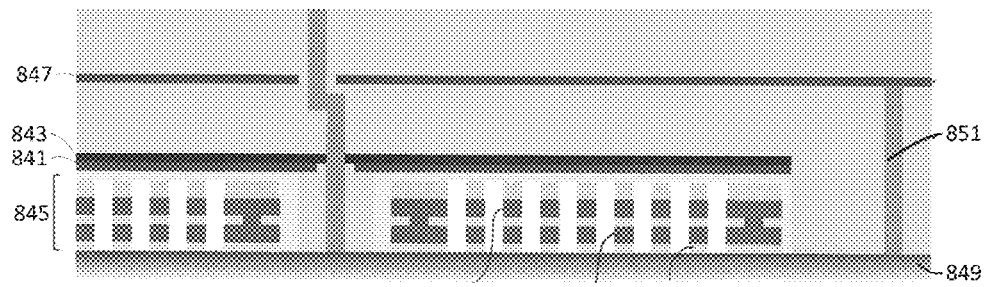
FIG. 8
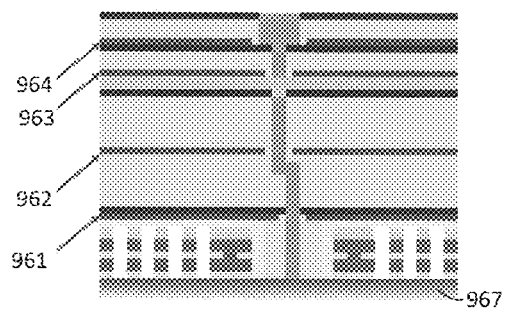
FIG. 9

INTEGRATED CIRCUIT WITH HYDROGEN ABSORPTION STRUCTURE

BACKGROUND

This application relates generally to non-volatile semiconductor memories of the flash memory type, their formation, structure and use.

There are many commercially successful non-volatile memory products being used today, particularly in the form of small form factor cards, USB drives, embedded memory, and Solid State Drives (SSDs) which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. Although four floating gate memory cells are shown in each string, the individual strings typically include 16, 32 or more memory cell charge storage elements, such as floating gates, in a column. Control gate (word) lines labeled WL0-WL3 and string selection lines, Drain Select Line, "DSL" and Source Select Line "SSL" extend across multiple strings over rows of floating gates. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel.

The top and bottom of the string connect to the bit line and a common source line respectively through select transistors (source select transistor and drain select transistor). Select transistors do not contain floating gates and are used to connect NAND strings to control circuits when they are to be accessed, and to isolate them when they are not being accessed.

NAND strings are generally connected by conductive lines in order to form arrays that may contain many NAND strings. At either end of a NAND string a contact area may be formed. This allows connection of the NAND string as part of the array. Metal contact plugs (or "vias") may be formed over contact areas to connect the contact areas (and thereby connect NAND strings) to conductive metal lines that extend over the memory array (e.g. bit lines). FIG. 2A shows bit line contacts BL0-BL4 and common source line contacts at either end of NAND strings. Vias may be formed by etching contact holes through a dielectric layer and then filling the holes with metal to form vias. Contacts of FIG. 2A are shown in cross section in FIGS. 2B and 2C.

SUMMARY

In some integrated circuits, including NAND flash memories, hydrogen may be present and may affect device characteristics. One or more hydrogen absorption structures may be built into an integrated circuit to absorb some or all of the hydrogen that may be present. A hydrogen absorption structure may be in the form of a layer of hydrogen absorbing material, such as titanium, which extends over devices (e.g. flash memory cells) formed on a substrate surface. Silicon nitride may be a significant source of hydrogen in some integrated circuits. A hydrogen absorption structure may be located between a silicon nitride layer and any devices that might be affected by hydrogen so that such hydrogen does not reach the devices. Hydrogen absorption structures may be electrically floating (unconnected to any other conductor) or may be connected to a substrate. In another arrangement, hydrogen absorption structures are incorporated into other structures such as dummy wiring that extends over a substrate. Some hydrogen absorption material may be incorporated into such dummy wiring. The dummy wiring may be formed in parallel with wiring for peripheral circuits so that few extra processing steps are required.

An example of an integrated circuit includes: a substrate; a plurality of transistors formed along a surface of the substrate; a dielectric layer overlying the plurality of transistors; and a hydrogen absorption structure overlying the dielectric layer, the hydrogen absorption structure extending over the plurality of transistors, the hydrogen absorption structure being electrically isolated from the plurality of transistors.

The hydrogen absorption structure may include one or more of: titanium (Ti), tantalum (Ta), ruthenium (Ru), hafnium (Hf), zirconium (Zr), lanthanum (La), and tungsten (W). The hydrogen absorption structure may consist of a layer of titanium (Ti) that extends over a memory cell array area of the integrated circuit and is not electrically connected with electrical circuits of the memory cell area or a peripheral area. The hydrogen absorption structure may be surrounded by dielectric material and is electrically isolated from all other electrical conductors. The hydrogen absorption structure may be electrically connected to the substrate. The hydrogen absorption structure may be formed in a dummy metal line. The hydrogen absorption structure may form a top layer of the dummy metal line. The integrated circuit may include active metal lines that connect circuits in the substrate. The integrated circuit may include one or more layers of silicon nitride and the hydrogen absorption structure may form a layer that extends between the one or more silicon nitride layers and the plurality of transistors. No silicon nitride may be located between the hydrogen absorption structure and the plurality of transistors. The plurality of transistors may be series connected floating gate transistors that form NAND strings in a NAND flash memory array.

An example of a method of forming a nonvolatile memory integrated circuit includes: forming a plurality of transistors along a surface of a substrate; forming a dielectric layer over the plurality of transistors; and forming a hydrogen absorption structure over the dielectric layer, the hydrogen absorption structure extending over the plurality of transistors, the hydrogen absorption structure being electrically isolated from the plurality of transistors.

Forming the hydrogen absorption structure may include depositing one or more of: titanium (Ti), tantalum (Ta), ruthenium (Ru), hafnium (Hf), zirconium (Zr), lanthanum (La), and tungsten (W). Forming the hydrogen absorption structure may include forming a layer of titanium (Ti) that extends over a memory cell array area of the integrated circuit and is not electrically connected with electrical circuits of the memory cell area or of a peripheral area. The method may also include forming an electrical connection between the substrate and the hydrogen absorption structure. Forming the hydrogen absorption structure may include patterning to form a plurality of dummy metal lines. The patterning may also form a plurality of active metal lines, the active metal lines connecting to circuits in the substrate, the dummy metal lines being isolated from all circuits in the substrate. The hydrogen absorption structure may be used as an etch-stop layer when etching an opening for via formation by performing a first etch step that stops on the hydrogen absorption structure and subsequently performing a second etch step that etches through the hydrogen absorption structure, the second etch step applying different etch parameters to the first etch step.

An example of a NAND flash memory integrated circuit includes: a substrate; a plurality of charge storage transistors formed along a surface of the substrate, the plurality of charge storage transistors electrically connected in series in a plurality of NAND strings; a dielectric layer overlying the plurality of NAND strings; and a titanium-containing hydrogen absorption structure overlying the dielectric layer, the titanium-containing hydrogen absorption structure extending over the plurality of NAND strings, the titanium-containing hydrogen absorption structure being electrically isolated from the plurality of NAND strings.

The titanium-containing hydrogen absorption structure may be surrounded by dielectric material that provides electrical isolation from all electrically conductive material. The titanium-containing hydrogen absorption structure may be electrically connected to the substrate.

Various aspects, advantages, features and embodiments are included in the following description of examples, which description should be taken in conjunction with the accompanying drawings.

BRIEF DESCRIPTION OF THE DRAWINGS

FIG. 1 is a block diagram of a prior art memory system.
FIGS. 6A-C illustrate steps in etching an opening through a hydrogen absorption structure.
FIGS. 7A-B illustrate a hydrogen absorption structure between a silicon nitride layer and memory cells.
FIG. 8 illustrates an example of a NAND flash memory with two hydrogen absorption structures.
FIG. 9 illustrates an example of a NAND flash memory with four hydrogen absorption structures.

DETAILED DESCRIPTION OF EXEMPLARY EMBODIMENTS

Memory System

Figure 2A:
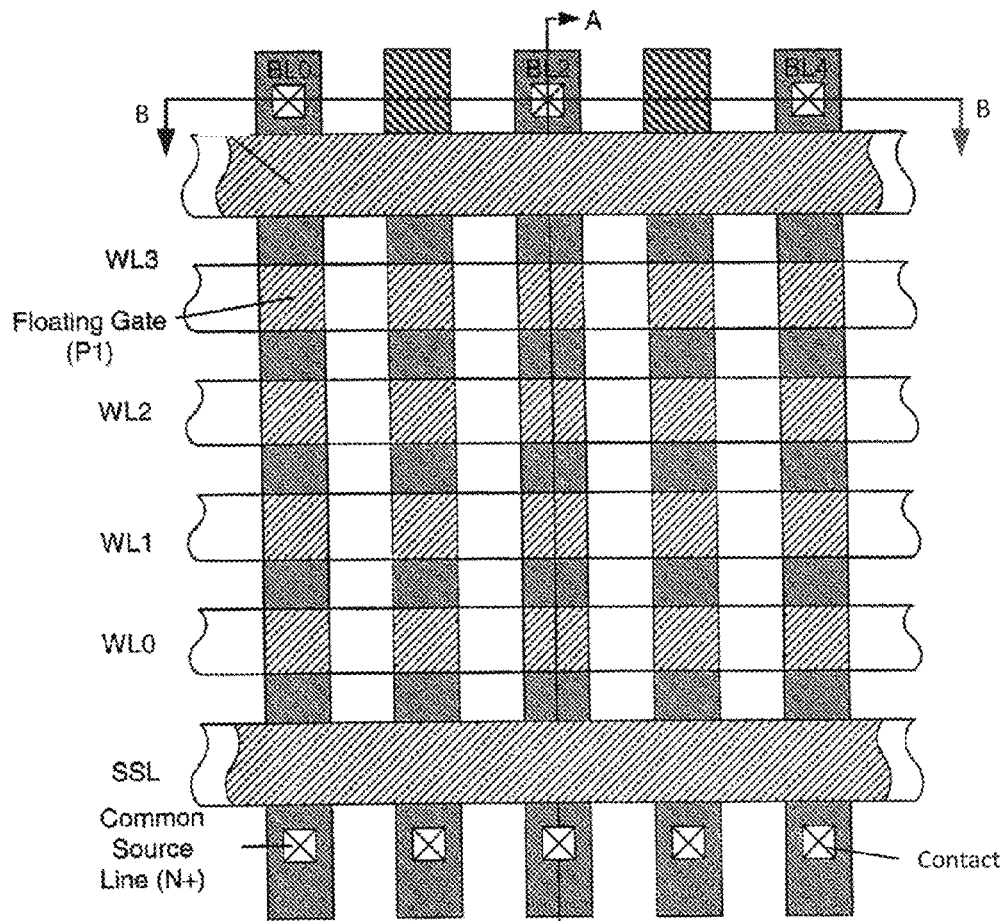
FIG. 2A is a plan view of a prior art NAND array.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described here may be used.

An example of a prior art memory system, which may be modified to include various structures described here, is illustrated by the block diagram of FIG. 1. A planar memory cell array 1 including a plurality of memory cells is controlled by a column control circuit 2, a row control circuit 3, a c-source control circuit 4 and a c-p-well control circuit 5. The memory cell array 1 is, in this example, of the NAND type similar to that described above in the Background. A control circuit 2 is connected to bit lines (BL) of the memory cell array 1 for reading data stored in the memory cells, for determining a state of the memory cells during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells are formed. The c-source control circuit 4 controls a common source line (labeled as "c-source" in FIG. 1) connected to the memory cells (M). The c-p-well control circuit 5 controls the c-p-well voltage.

The data stored in the memory cells are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertible into a mating socket of a host system. Such a card may include the entire memory system, or the controller and memory array, with associated peripheral circuits, may be provided in separate cards. The memory system of FIG. 1 may also be used in a Solid State Drive (SSD) or similar unit that provides mass data storage in a tablet, laptop computer, or similar device. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

Figure 2B:
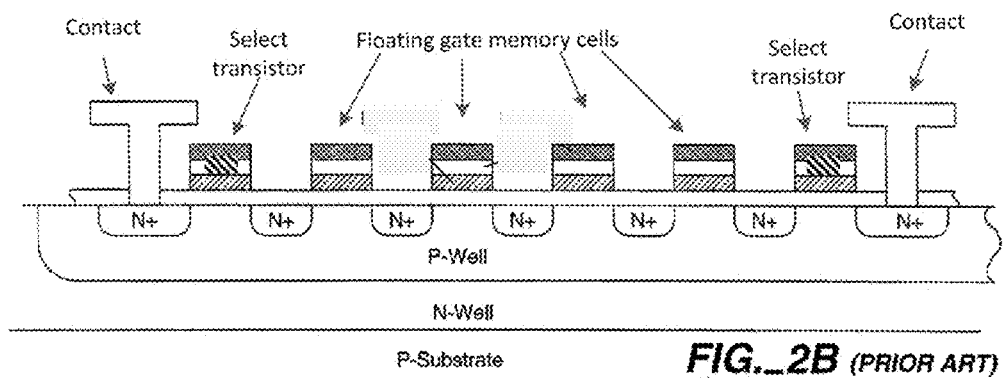
FIG. 2B shows a cross section of the NAND array of FIG. 2A.
Figure 2C:
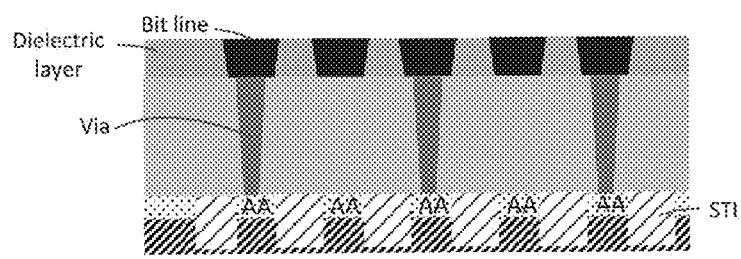
FIG. 2C shows another cross section of the NAND array of FIG. 2A.

FIGS. 2A-2C show different views of a prior art NAND flash memory. In particular, FIG. 2A shows a plan view of a portion of such a memory array including bit lines and word lines (this is a simplified structure with a small number of word lines and bit lines). FIG. 2B shows a cross section along A-A (along a NAND string) showing individual memory cells that are connected in series. Contact plugs, or vias (the two terms are used interchangeably in the present application) are formed at either end to connect the NAND strings in the memory array to conductive lines (e.g. connecting to bit lines at one end and to a common source line at the other end). Such a via may be formed of metal that is deposited into a contact hole that is formed in a dielectric layer. FIG. 2C shows a cross section along B-B of FIG. 2A. This view shows metal contact plugs extending down through contact holes in a dielectric layer to make contact with active areas ("AA") in the substrate (i.e. with N+ areas of FIG. 2B). STI regions are located between active areas of different strings to electrically isolate an individual NAND string from its neighbors. Bit lines extend over the memory array in a direction perpendicular to the plane of the cross section shown. Alternating bit lines are connected to vias in the cross section shown. (It will be understood that other vias, that are not visible in the cross section shown, connect the remaining bit lines to other active areas). In this arrangement, locations of vias alternate so that there is more space between vias and thus less risk of contact between vias. Other arrangements are also possible. A more complex stack of layers, including metal layers and dielectric layers, may extend over an integrated circuit.

In some integrated circuits, device characteristics may be affected by the presence of hydrogen in the integrated circuit structure. For example, hydrogen in flash memories may have negative effects on memory cell characteristics, e.g. hydrogen in a gate dielectric layer may result in shorter data retention. hydrogen in an integrated circuit may come from various sources. A silicon nitride layer may be the source of hydrogen in integrated circuits such as flash memories. In some cases, multiple silicon nitride layers are present in such structures which may result in significant hydrogen. Such hydrogen may migrate to locations where it impacts device characteristics (e.g. migrating to gate dielectric). Thus, layers of silicon nitride that are some distance above a memory array may affect memory performance.

Figure 3:
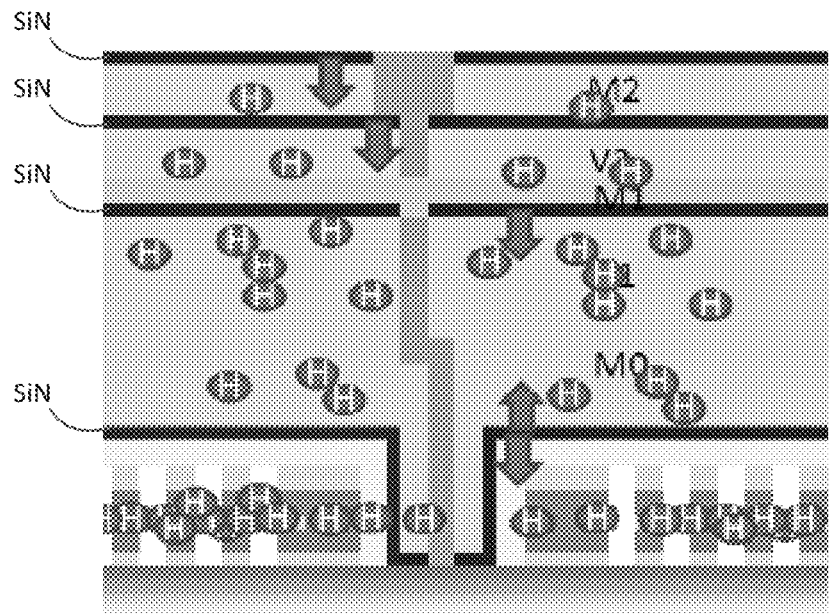
FIG. 3 shows hydrogen ions in a prior art NAND flash memory.

FIG. 3 shows an example of a prior art NAND flash memory with multiple silicon nitride layers and with hydrogen ("H") ions present at various locations. Hydrogen ions may migrate from silicon nitride layers to other locations in the memory, including into memory cells where the characteristics of the memory cells may be affected.

Figure 4:
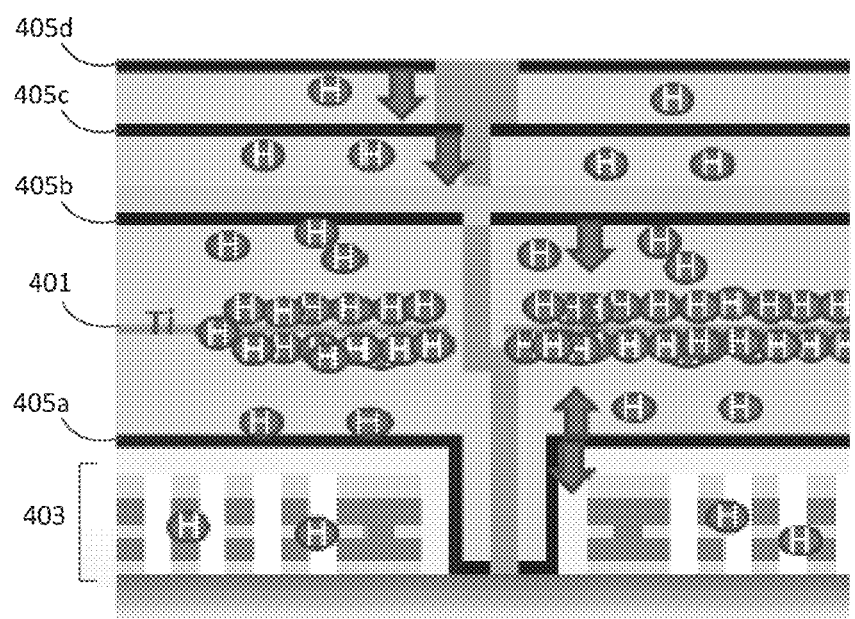
FIG. 4 shows a NAND flash memory with a hydrogen absorption structure.

FIG. 4 shows another example of a NAND flash memory. A hydrogen absorption structure 401 is provided in the NAND flash memory to absorb some or all of the hydrogen ions so that they remain attached to the hydrogen absorption structure 401, which is physically removed from the memory cells 403. Such hydrogen is maintained at a safe location where it does not affect the memory cells 403. Thus, the effects of hydrogen ions originating in the silicon nitride layers 405a-d is at least partially neutralized by the hydrogen absorption structure 401. While some hydrogen ions may migrate into the memory cells, the number of such hydrogen ions may be significantly reduced and the negative effects on device characteristics may thereby be improved.

Hydrogen absorption structure 401 of FIG. 4 is formed of a layer of material that has a high affinity for Hydrogen, which in this case is titanium (Ti). Other materials may also have a high affinity for Hydrogen and may also be used, either alone or in combination, to absorb hydrogen. Examples of such materials include: tantalum (Ta), ruthenium (Ru), hafnium (Hf), zirconium (Zr), lanthanum (La), and tungsten (W).

The Hydrogen absorption structure 401 of FIG. 4 is formed as a layer, with some openings where vias are formed. However, other physical structures may also be used and a hydrogen absorption structure is not limited to a layer arrangement. For example, discontinuous portions of hydrogen absorption material may be used, such as strips. A grid of material, or isolated dots of material, or some other geometric arrangement of hydrogen absorbing material may be used. While only one hydrogen absorption structure is shown in FIG. 4, two or more such structures may be used. For example, another layer of titanium may be added to provide additional hydrogen absorption. In general, the number and geometry of hydrogen absorption structure(s) may be adapted to the amount of hydrogen that is present, or is likely to be present, in an integrated circuit. Thus, where multiple silicon nitride layers are provided, a hydrogen absorption layer may be increased in thickness or additional hydrogen absorption layer may be provided to neutralize some or all of the hydrogen from the silicon nitride layers.

A Hydrogen absorption layer may be formed by any suitable process. An example of steps for forming a Hydrogen absorption layer such as shown in FIG. 4 are illustrated in FIGS. 5A-L.

Figures 5A, 5B, 5C, 5D:
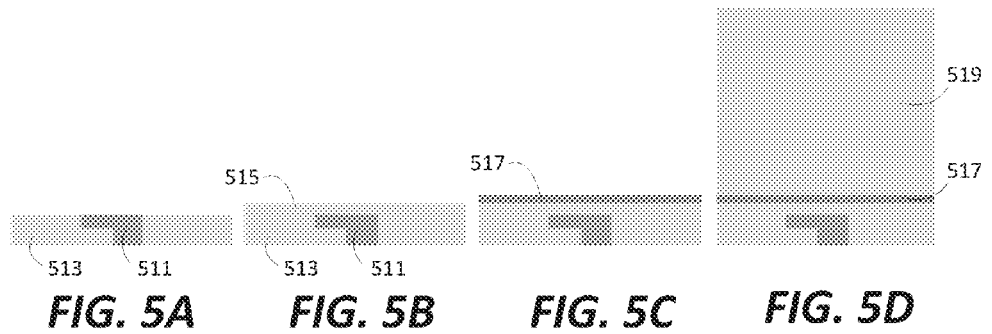
FIGS. 5A-L illustrate steps in forming a hydrogen absorption structure.

FIG. 5A shows a cross section of a portion of a NAND flash memory array at an intermediate stage of fabrication after planarization that leaves a metal via 511 (e.g. tungsten) in a dielectric layer 513 (e.g. silicon oxide). Via 511 connects to a contact area in a substrate such as a source or drain contact area at the end of a NAND string (not shown).

FIG. 5B shows the structure of FIG. 5A after formation of a first dielectric layer 515 that overlies the dielectric layer 513 and via 511.

FIG. 5C shows the structure of FIG. 5B after deposition of a Hydrogen absorption material 517 to form a layer that extends over the first dielectric layer 515. In this example the Hydrogen absorption material is titanium.

FIG. 5D shows the structure of FIG. 5C after formation of a second dielectric layer 519 that overlies the hydrogen absorption layer 517. The second dielectric layer 519 may be formed of the same dielectric material as the first dielectric layer 515 (e.g. silicon oxide). The second dielectric layer 519 may be significantly thicker than the first dielectric layer 515 so that the hydrogen absorption layer 517 is close to the bottom of this stack (stack of first dielectric, hydrogen absorption, and second dielectric layers). This stack may replace a single layer of dielectric used in prior art structures.

Figures 5E, 5F, 5G, 5H:
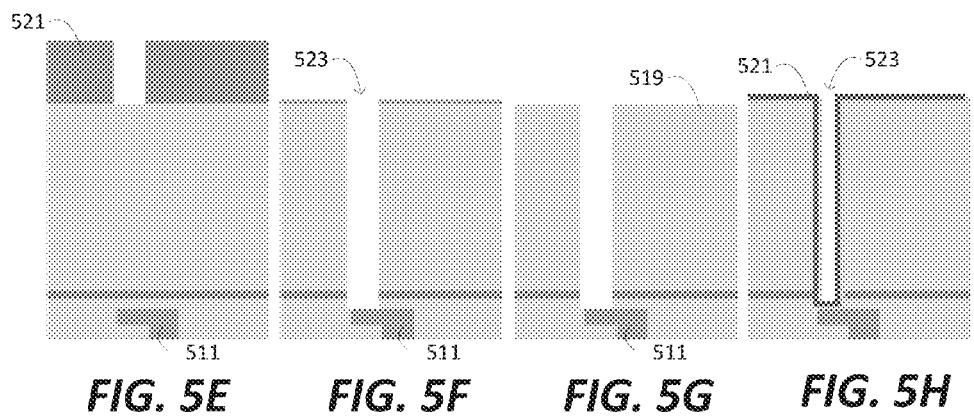

FIG. 5E shows the structure of FIG. 5D after a photoresist layer 521 is formed over second dielectric layer and is patterned to define an opening where a via is to be located.

FIG. 5F shows the structure of FIG. 5E after anisotropic etching (e.g. Reactive Ion Etching, RIE) according to the pattern defined in FIG. 5E so that an opening 523 extends down to expose the top surface of the via 511.

FIG. 5G shows the structure of FIG. 5F after cleaning to remove any remaining photoresist from the top surface of upper dielectric layer 519 and to clean any residue from the upper surface of the via 511 (i.e. from bottom of opening).

FIG. 5H shows the structure of FIG. 5G after deposition of a spacer layer 521 along exposed surfaces of the opening 523. Spacer layer 521 may be formed of a suitable dielectric such as silicon oxide and may be deposited by a suitable method that produces good sidewall coverage, e.g. Chemical Vapor Deposition (CVD) or Atomic Layer Deposition (ALD).

Figures 5I, 5J, 5K, 5L:
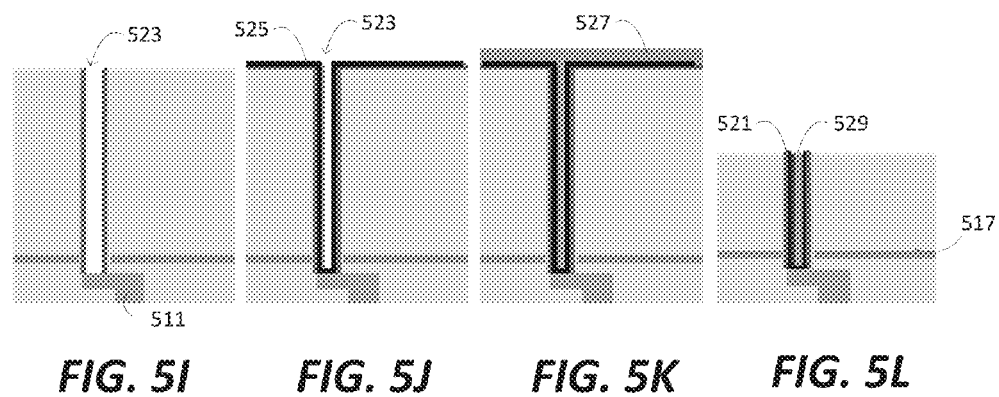

FIG. 5I shows the structure of FIG. 5H after etching back spacer layer 521 to expose via 511 at the bottom of opening 523. Etching back may use anisotropic etching so that spacer layer 521 is removed from bottom of opening 523 and top surface of second dielectric layer 519 while remaining on sidewalls of opening 523.

FIG. 5J shows the structure of FIG. 5I after deposition of a barrier layer 525 along exposed surfaces including side and bottom surfaces of opening 523. Barrier layer 525 may be formed of a suitable barrier metal such as titanium and or other materials such as titanium nitride.

FIG. 5K shows the structure of FIG. 5J after deposition of metal 527 to fill the opening 523. The metal may be tungsten, copper, or other suitable metal.

FIG. 5L shows the structure of FIG. 5K after planarization to remove excess metal and barrier material. Planarization may use Chemical Mechanical Polishing (CMP). The resulting via 529 extends through the hydrogen absorption layer 517 without making physical contact. Via 529 is physically separated, and electrically isolated, from the hydrogen absorption structure 517 by the spacer layer 521. The hydrogen absorption structure 517 may be a continuous layer other than at locations where vias are formed.

The example process of FIGS. 5A-L may be modified in various ways. For example, the etching step of FIGS. 5E-F may be performed as a single continuous etch step (e.g. ending after a predetermined time) or may be performed as two or more separate steps. FIG. 6A-C illustrate an example of how such an opening may be etched in three separate etch steps to provide accurate depth control and uniformity.

FIG. 6A shows a structure after completion of a first etch step that extends through the second dielectric layer 619, stopping on the hydrogen absorption structure 617. The first etch step may provide a relatively high etch rate and the hydrogen absorption structure 617 (titanium layer) may act as an etch stop layer. The etch may be selective to the second dielectric layer 619 so that etch conditions provide a high etch rate for the material of the second dielectric layer (e.g. silicon oxide) and a substantially lower etch rate for the material of the hydrogen absorption layer (e.g. titanium). This etch step may stop at a predetermined time, or alternatively may be stopped in response to feedback that indicates that openings have reached the hydrogen absorption layer 617. For example, end-point detection may be based on detection of certain etch byproducts in an etch chamber indicating that titanium (or other hydrogen absorption material) is being etched. Thus, the openings stop accurately and uniformly at the end of this etch step. The total thickness to be etched in order to expose the via is shown as V1 and it can be seen that the first etch step extends the opening a significant portion of V1 (e.g. 70%-90%)

FIG. 6B illustrates the structure of FIG. 6A after completion of a second etch step that etches through the hydrogen absorption structure 617. The second etch step may end after a predetermined time, or alternatively may be stopped by end-point detection. For example, a drop in etch byproducts from etching of titanium (or other hydrogen absorption material) may indicate that etching has passed through the hydrogen absorption layer 617. Process conditions for the second etch step may be selective to titanium (or other hydrogen absorption material).

FIG. 6C shows the structure of FIG. 6B after a third etch step that extends opening through the first dielectric layer 615 to expose the top surface of via 611. The third etch step may use a low etch rate to provide good uniformity and control. Because the first dielectric layer 615 is relatively thin (thinner than the second dielectric layer) the low etch rate for this step may not significantly increase overall etch time.

It can be seen that the addition of a titanium layer at the location shown may be used to achieve accurate, uniform etching by employing the titanium layer as an etch-stop layer. Furthermore, this layer may allow accurate measurement of dielectric layer thickness. In some prior art structures, a single dielectric layer was used instead of the stack shown in FIGS. 6A-C. Thus, the entire thickness V1 was made up of dielectric, which was often the same as underlying dielectric. This made accurate measurement of thickness V1 very difficult. In contrast, the thickness of second dielectric layer 619 may be easily measured because there is a clear interface between hydrogen absorption structure 617 and second dielectric layer 619. The overall thickness V1 of the stack may be estimated from the measured thickness of second dielectric layer 619.

FIG. 7A shows another example of a hydrogen absorption structure. In this case, a layer of hydrogen absorption material (e.g. titanium) forms hydrogen absorption structure 731. Hydrogen absorption structure 731 is placed under, and in contact with, a layer of silicon nitride 733 that extends over a NAND flash memory array 735. Thus, the hydrogen absorption structure lies between the silicon nitride layer 733 and the memory array 735 so that hydrogen ions migrating from the silicon nitride layer 733 may be absorbed before they reach the memory array 735. In this example, no silicon nitride is present between the hydrogen absorption structure and the devices in the substrate (i.e. the titanium layer is closer to the substrate than any silicon nitride layer)

FIG. 7B shows the structure of FIG. 7A after formation of a via 737 that extends through the hydrogen absorption structure 731. The via may be formed by etching an opening, then forming a dielectric spacer along sidewalls of the opening, and filling the opening with barrier material and metal. In this way, the via may pass through the hydrogen absorption structure without physically contact.

FIG. 8 shows an example of a portion of a NAND flash memory array that includes two hydrogen absorption structures. A first hydrogen absorption structure 841 extends directly under a silicon nitride layer 843, separating the silicon nitride layer 843 from the memory array 845 (similar to FIG. 7B). A second hydrogen absorption layer 847 extends at a higher level at a location similar to that shown in FIG. 4.

Second hydrogen absorption layer 847 is electrically connected to the substrate 849 in this example. A via 851 extends from second hydrogen absorption layer 847 to the substrate 849. Such a connection may prevent second hydrogen absorption structure 847 from becoming charged (i.e. providing a path for discharge). This may allow second hydrogen absorption structure 847 to be more effective by continuing to absorb hydrogen ions rather than becoming charged up and repelling hydrogen ions. First hydrogen absorption structure 841 is not connected to substrate in this example. In other examples, all hydrogen absorption structures may be connected to the substrate and may thereby be electrically connected together.

The number of hydrogen absorption structures may be appropriate to the particular integrated circuit design. For example, the number and size of such structures may depend on the number and thicknesses of silicon nitride layers present. In general, if there is more silicon nitride in an integrated circuit, more hydrogen may be present, and more hydrogen absorption material will be appropriate to controlling hydrogen induced damage.

FIG. 9 shows an example of an integrated circuit that includes four hydrogen absorption structures 961-4 at various levels above a substrate 967. These hydrogen absorption structures may be connected to substrate 967 to prevent charging. Alternatively, one or more hydrogen absorption structure(s) may be completely electrically isolated (i.e. floating) by surrounding the hydrogen absorption structure with dielectric.

While the above examples of hydrogen absorption structures are in the form of layers that extend over a memory array, other arrangements may also be used and may provide integration of formation of hydrogen absorption structures with previous process flows.

Figure 10:
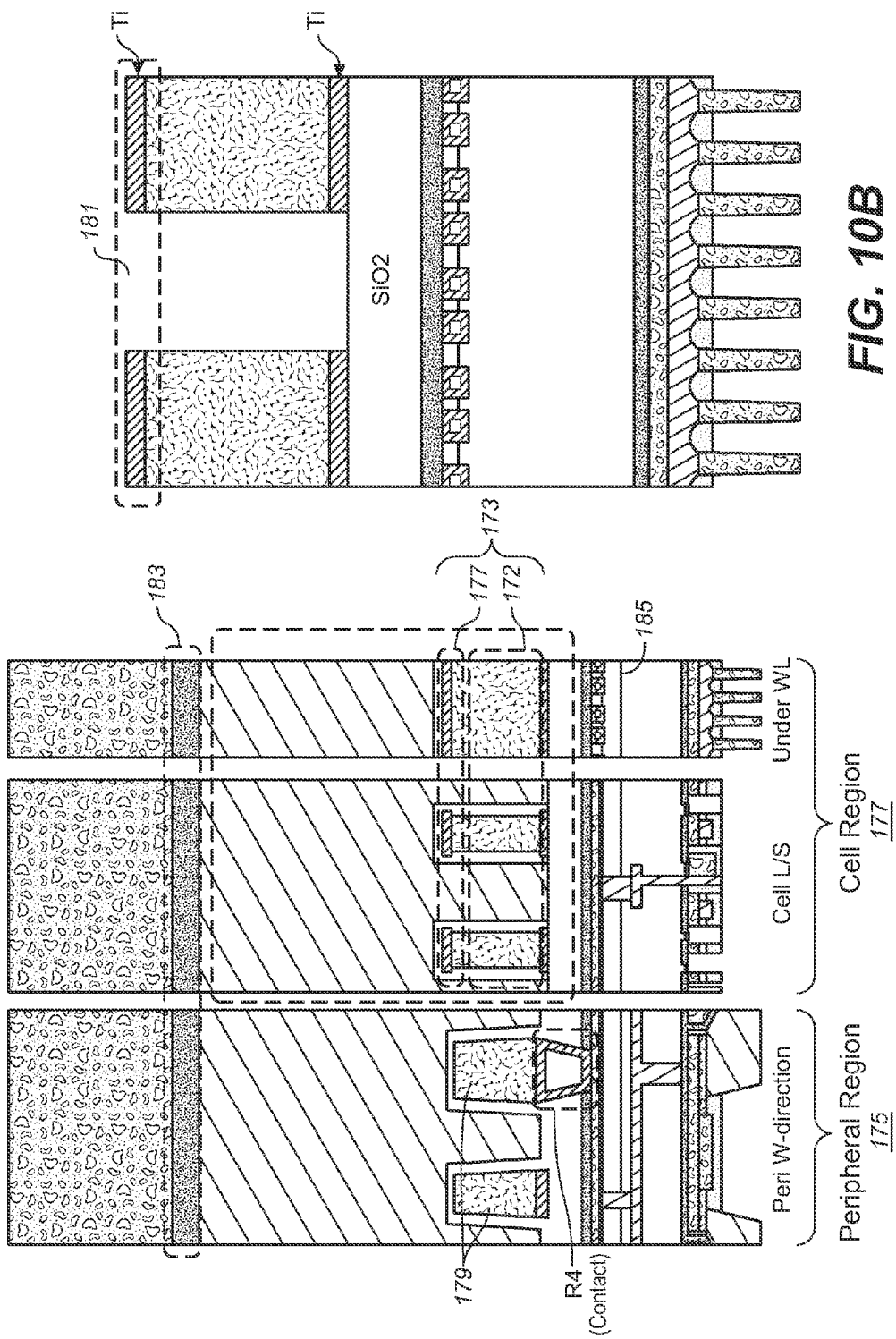
FIGS. 10A-B illustrate another example of a hydrogen absorption structure.

FIG. 10A shows an example in which hydrogen absorption structures 171 are formed in dummy wiring 173 that extends over a memory array area. In general, multiple layers of metal wiring are provided in a memory integrated circuit. Large wiring may be used in peripheral areas of such an integrated circuit. Such large wiring may not be needed, and may not be present, in a memory array area. In FIG. 10, such large wiring is provided not only in the peripheral area 175, but is also provided in the cell region 177 as dummy wiring 173. The dummy wiring 173 may be formed in parallel with formation of peripheral wiring 179. Such wiring may be formed by depositing metal layers and then etching the metal layers to pattern them into metal lines 172. Large wiring 179 in the peripheral region 175 contacts lower wiring and/or contact areas of peripheral transistors in the substrate through contact R4. In contrast, dummy wiring in the cell region 177 is unconnected to other wiring or to contact areas of underlying NAND strings. Dummy wiring 173 in cell region 177 may include separate metal lines that are electrically isolated from each other and from all other conductors (i.e. each such line may be electrically floating). Alternatively, metal lines of cell region 177 may be electrically connected to the substrate and thus to each other. Metal lines of cell region 177 may also be directly connected together to form a single physical body over the memory array area. In the example of FIG. 10A, dummy metal lines 173 are formed of metal layers, including an aluminum layer 172, and a top titanium layer 171. No top titanium layer is present in corresponding peripheral lines 179. The top titanium layer may be selectively removed in peripheral region 175. The titanium may act as hydrogen absorption structures and the thicknesses of the titanium may be selected to absorb sufficient hydrogen to substantially reduce effects on memory cells.

FIG. 10B provides a more detailed illustration of the structure of dummy metal lines that include a top titanium layer 181. Titanium (or other hydrogen absorption material) at this location may absorb hydrogen ions migrating from overlying silicon nitride layers towards the memory array (e.g. from silicon nitride layer 183 of FIG. 10A). Such a structure may be used alone, or in combination with one or more other hydrogen absorption structures (e.g. at lower levels), for example Ti layer 185 of FIG. 10A. Titanium is also provided along the bottom of the dummy wiring in this example.

Figure 11:
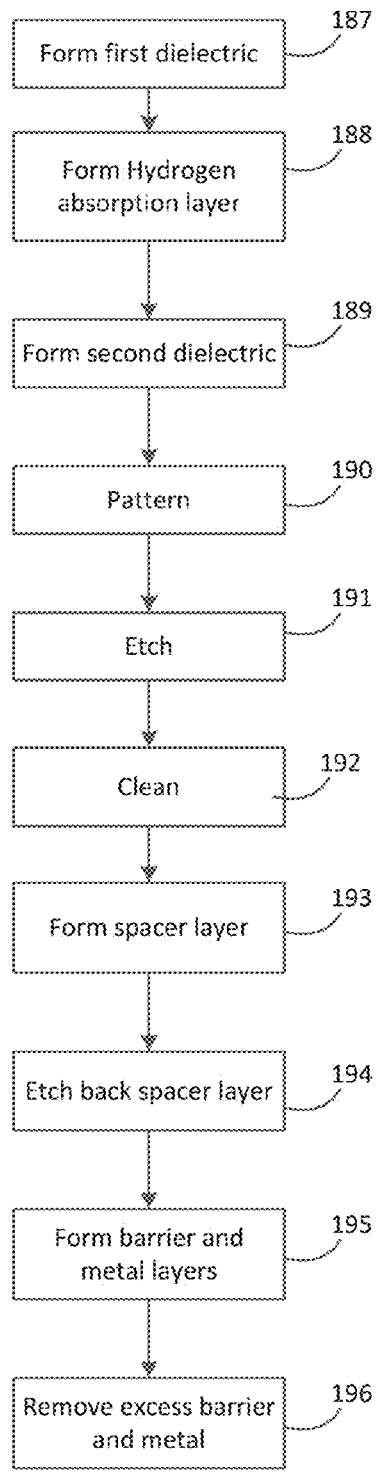
FIG. 11 illustrates an example of steps used in forming a hydrogen absorption structure.

FIG. 11 illustrates an example of process steps that may be used to form an integrated circuit with a hydrogen absorption structure (e.g. as previously described with respect to FIGS. 5A-5L). A first dielectric layer is formed 187. Then a hydrogen absorption layer is formed 188 on the first dielectric layer. A second dielectric layer is formed 189 on the hydrogen absorption layer. Subsequently, a pattern is established 190 and an etch is performed 191 according to the pattern so that openings extend through the second dielectric layer, hydrogen absorption layer, and first dielectric layer. Etching may be performed in three steps, using the hydrogen absorption layer as an etch-stop layer for the first step. Cleaning is performed 192 and a spacer layer is deposited 193 to cover surfaces of the opening. Then the spacer layer is etched back 194 to expose a via at the bottom of the opening. Barrier and metal layers are then formed 195 in the opening and excess barrier and metal materials are removed 196 (e.g. by CMP).

While examples above are directed to NAND flash memory integrated circuits and formation of such integrated circuits, it will be understand that structures and methods described may be applied to a range of integrated circuits including other forms of memory, programmable logic circuits, microprocessors, communication devices, etc.

CONCLUSION

Although the various aspects have been described with respect to examples, it will be understood that protection within the full scope of the appended claims is appropriate.

It is claimed:

1. An integrated circuit comprising:
a substrate;
a NAND flash memory cell array formed along a surface of the substrate;
a dielectric layer overlying the NAND flash memory cell array; and
a hydrogen absorption structure overlying the dielectric layer, the hydrogen absorption structure extending over the NAND flash memory cell array, the hydrogen absorption structure being an electrical conductor substantially surrounded by dielectric material electrically isolated from the NAND flash memory cell array and electrically connected to the substrate.

2. The integrated circuit of claim 1 wherein the hydrogen absorption structure comprises one or more of: titanium (Ti), tantalum (Ta), ruthenium (Ru), hafnium (Hf), zirconium (Zr), lanthanum (La), and tungsten (W).

3. The integrated circuit of claim 1 wherein the hydrogen absorption structure comprises a layer consisting of titanium (Ti) that extends over the NAND flash memory cell array and is not electrically connected with electrical circuits of the NAND flash memory cell array or a peripheral area.

4. The integrated circuit of claim 1 wherein the hydrogen absorption structure is formed in a dummy metal line.

5. The integrated circuit of claim 4 wherein the hydrogen absorption structure forms a top layer of the dummy metal line.

6. The integrated circuit of claim 5 further comprising a plurality of active metal lines that connect circuits in the substrate.

7. The integrated circuit of claim 1 further comprising one or more layers of silicon nitride and wherein the hydrogen absorption structure forms a layer that extends between the one or more silicon nitride layers and the NAND flash memory cell array.

8. The integrated circuit of claim 7 wherein no silicon nitride is located between the hydrogen absorption structure and the NAND flash memory cell array.

9. The integrated circuit of claim 1 wherein the NAND flash memory cell array includes series connected floating gate transistors that form NAND strings.

10. A method of forming a nonvolatile memory integrated circuit comprising:
forming a NAND flash memory cell array along a surface of a substrate;
forming a dielectric layer over the NAND flash memory cell array;
forming a hydrogen absorption structure over the dielectric layer, the hydrogen absorption structure extending over the NAND flash memory cell array, the hydrogen absorption structure being an electrical conductor that is electrically isolated from the NAND flash memory cell array; and forming an electrical connection between the substrate and the hydrogen absorption structure.

11. The method of claim 10 wherein forming the hydrogen absorption structure comprises depositing one or more of: titanium (Ti), tantalum (Ta), ruthenium (Ru), hafnium (Hf), zirconium (Zr), lanthanum (La), and tungsten (W).

12. The method of claim 11 wherein forming the hydrogen absorption structure comprises forming a layer consisting of titanium (Ti) that extends over a memory cell array area of the integrated circuit and is not electrically connected with electrical circuits of the memory cell area or of a peripheral area.

13. The method of claim 11 wherein forming the hydrogen absorption structure further comprises patterning to form a plurality of dummy metal lines.

14. The method of claim 13 wherein the patterning also forms a plurality of active metal lines, the active metal lines connecting to circuits in the substrate, the dummy metal lines being isolated from all circuits in the substrate.

15. The method of claim 10 further comprising using the hydrogen absorption structure as an etch-stop layer when etching an opening for via formation by performing a first etch step that stops on the hydrogen absorption structure and subsequently performing a second etch step that etches through the hydrogen absorption structure, the second etch step applying different etch parameters to the first etch step.

* * * * *